(12) United States Patent
Petrashov et al.

(10) Patent No.: US 10,782,364 B2
(45) Date of Patent: Sep. 22, 2020

(54) QUANTUM INTERFERENCE DEVICE

(71) Applicants: Royal Holloway and Bedford New College, Egham (GB); York Instruments Ltd., Heslington (GB)

(72) Inventors: Victor Tikhonovich Petrashov, Egham (GB); Christopher Checkley, Selby (GB)

(*) Notice: Subject to any disclaimer, the term of this patent is extended or adjusted under 35 U.S.C. 154(b) by 0 days.

(21) Appl. No.: 16/328,487

(22) PCT Filed: Jul. 13, 2017

(86) PCT No.: PCT/GB2017/052069
§ 371 (c)(1),
(2) Date: Feb. 26, 2019

(87) PCT Pub. No.: WO2018/037202
PCT Pub. Date: Mar. 1, 2018

(65) Prior Publication Data
US 2019/0195965 A1      Jun. 27, 2019

(30) Foreign Application Priority Data

Aug. 26, 2016   (WO) ............... PCT/GB2016/052664
Mar. 3, 2017    (GB) .................................. 1703472.9

(51) Int. Cl.
*G01R 33/035* (2006.01)
(52) U.S. Cl.
CPC ................................ *G01R 33/035* (2013.01)

(58) Field of Classification Search
CPC ...... H01B 13/00; H01B 13/106; H01B 12/00; H01B 1/00; G01R 33/3802;
(Continued)

(56) References Cited

U.S. PATENT DOCUMENTS 4,151,605 A * 4/1979 Faris ..................... G11C 11/44
257/31
4,843,504 A * 6/1989 Barnes ................. F16C 32/0438
310/10
(Continued)

FOREIGN PATENT DOCUMENTS

EP        0775917       5/1997
JP        08-316536     11/1996
(Continued)

OTHER PUBLICATIONS

Andreev, "The Thermal Conductivity of the Intermediate State in Superconductors", Soviet Physics JETP, vol. 19, No. 5, pp. 1228-1231 (Nov. 1964).
(Continued)

*Primary Examiner* — Vinh P Nguyen
(74) *Attorney, Agent, or Firm* — Cook Alex Ltd.

(57) ABSTRACT

A quantum interference device includes a superconducting loop interrupted by a gap, a plurality of normal conductor segments bridging the gap; and an interferometer connected to the normal conductor segments, wherein the normal conductor segments are spaced apart. There may be 2N+1 normal conductor segments, where N is a positive integer, which may be of equal length and evenly spaced. The device produces a larger signal than a conventional quantum interference device.

17 Claims, 4 Drawing Sheets

(58) Field of Classification Search
CPC ............ G01R 33/3815; G01R 13/342; G01R 29/0276; G01R 33/0356; G01R 33/0358; G01R 33/0017; G01R 33/035; G01R 33/0354; H03H 7/01; G11C 11/44; H01L 27/18; H01L 39/223; H01L 39/249; H01L 39/2493; G06N 10/00
See application file for complete search history.

(56) References Cited

U.S. PATENT DOCUMENTS

| | | | | |
|---|---|---|---|---|
| 5,326,986 | A | * | 7/1994 | Miller, Jr. ............ G01R 33/035 257/31 |
| 5,618,777 | A | * | 4/1997 | Hey-Shipton ............ H03H 7/03 505/210 |
| 2003/0111659 | A1 | | 6/2003 | Tzalenchuk et al. |
| 2006/0097747 | A1 | | 5/2006 | Amin |
| 2018/0267115 | A1 | * | 9/2018 | Petrashov .......... G01R 33/0354 |

FOREIGN PATENT DOCUMENTS

| | | |
|---|---|---|
| WO | WO2012/007736 | 1/2012 |
| WO | WO2017/037436 | 3/2017 |

OTHER PUBLICATIONS

Beev et al., "Cryogenic time-domain multiplexer based on SQUID arrays and superconducting/normal conducting switches", Journal of Physics: Condensed Matter, vol. 507, No. 4, 42003 (May 12, 2014).

Checkley et al., "Andreev interferometers in a strong radio-frequency field", Journal of Physics: Condensed Matter, vol. 23, No. 13, 135301 (Mar. 14, 2011) (6 pages).

Divincenzo, "The Physical Implementation of Quantum Computation", Fortschritte der. Physik, 48: 771 (2000) (9 pages).

Giazotto et al., "SQUIPT—Superconducting Quantum Interference Proximity Transistor", Nature Physics. 6 (4): 254-259 (2010).

Lupascu et al., "Quantum non-demolition measurement of a superconducting two-level system", Nature Physics. 3: 119-125 (2007).

Petrashov et al., "Phase Controlled Conductance of Mesoscopic Structures with Superconducting 'Mirrors'", The American Physical Society, vol. 74, No. 26, pp. 5268-5271 (Jun. 26, 1995).

Petrashov et al., "Andreev Probe of Persistent Current States in Superconducting Quantum Circuits", Phys Rev Letters, 95: 147001 (2005).

Ryhänen, T. et al., "SQUID Magnetometers for Low-Frequency Applications", J. Low Temp. Phys. 76(5-6), pp. 287-386, (1989).

Schoelkopf et al., Qubits as Spectrometers of Quantum Noise (2008).

International Search Report and Written Opinion, counterpart PCT application PCT/GB2017/052069, 15 pages (dated Oct. 12, 2017).

* cited by examiner

QUANTUM INTERFERENCE DEVICE

CROSS-REFERENCE TO RELATED APPLICATIONS

The present application is a U.S. National Stage of PCT International Patent Application No. PCT/GB2017/052069, filed Jul. 13, 2017, which claims priority to PCT International Patent Application No. PCT/GB2016/052664, filed Aug. 26, 2016 and GB Application No. 1703472.9, filed Mar. 3, 2017, all of which are hereby incorporated herein in their entirety by reference.

BACKGROUND

Field

The present invention relates to superconducting devices and in particular to superconducting devices with improved sensitivity to magnetic fields.

Various quantum interference devices which can be used as flux sensors, transistors or qubits are disclosed in WO 2012/007736 A1. Two examples of the devices are depicted in FIGS. 1 and 2 appended hereto.

In the device of FIG. 1, quantum interference devices 50 comprises a superconducting loop 51 interrupted by a normal conductor segment 52 which connects to the superconducting loop 51 at junctions 53, 54. A two branch 10 interferometer 55 is connected to the normal conductor segment 52. The two branches 55a, 55b are connected to the midpoint of the normal conductor segment 52 to form a cross.

A first branch 55a of the interferometer includes a barrier 56 separating the normal leads 57, 58 from the normal conductor segment 52. A second branch 55b of the interferometer comprises a normal spur 59 connecting to the normal conductor segment 52 and superconducting leads 60, 61. When a current is passed across the interferometer 55, quasiparticles are reflected from the normal:superconducting interfaces 53, 54 (Andreev reflection). The flux through the superconducting loop 51 affects the phase difference between interfaces 53 and 54 and hence causes quantum interference between the electrons reflected by the two boundaries. Therefore the current I across the interferometer 55 is sensitive to the flux $\phi$.

In the variant of FIG. 2, extra current leads 62, 63 are provided to convert the interferometer to a transistor. The electrical conductance across the interferometer is controlled by the bias current $I_b$ in the superconducting wire.

SUMMARY OF THE INVENTION

It is an aim of the invention to provide improved quantum interference devices.

According to the present invention there is provided a quantum interference device comprising a superconducting loop interrupted by a gap; a plurality of normal conductor segments bridging the gap; and an interferometer connected to the normal conductor segments, wherein the normal conductor segments are spaced apart.

According to the present invention, there is also provided a quantum interference device comprising an incomplete superconducting loop; a pair of branches extending in parallel from the ends of the superconducting loop; a plurality of normal conductor segments bridging between the branches; and a normal conducting crosspiece connected to the midpoints of the normal conductor segments.

According to the present invention there is also provided a compound device comprising a plurality of quantum interference devices as described above wherein the interferometers of the quantum interference devices are connected in series.

In an embodiment of the compound device the superconducting loops of the quantum interference devices fit in segments of a circle.

BRIEF DESCRIPTION OF THE DRAWINGS

Exemplary embodiments of the present invention are described further below with reference to the accompanying drawings, in which.

In the various drawings, like parts are indicated by like references.

DESCRIPTION OF EMBODIMENTS

Quantum interference devices according to the invention can be used for various purposes, e.g. as magnetic field (or flux) sensors, transistors, qubits, or readout devices for qubits. A quantum interference device generates a signal, in the form of a varying resistance of the interferometer crosspiece, that varies in accordance with the flux coupled through the superconducting loop. The present invention aims to provide a quantum interference device in which the magnitude of the signal, and desirably the signal-to-noise ratio (SNR), is increased.

Figure 1:
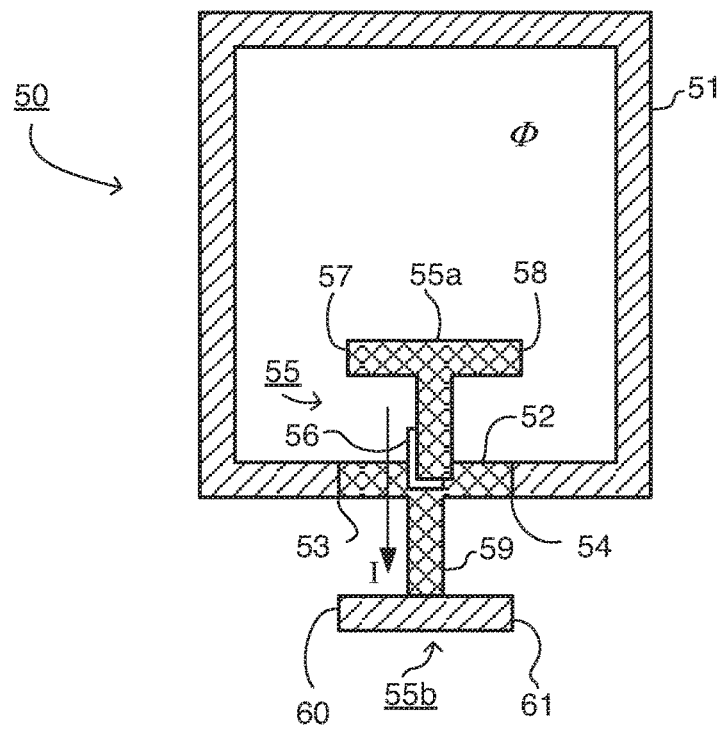
FIG. 1 depicts a quantum interference device known in the art.
Figure 2:
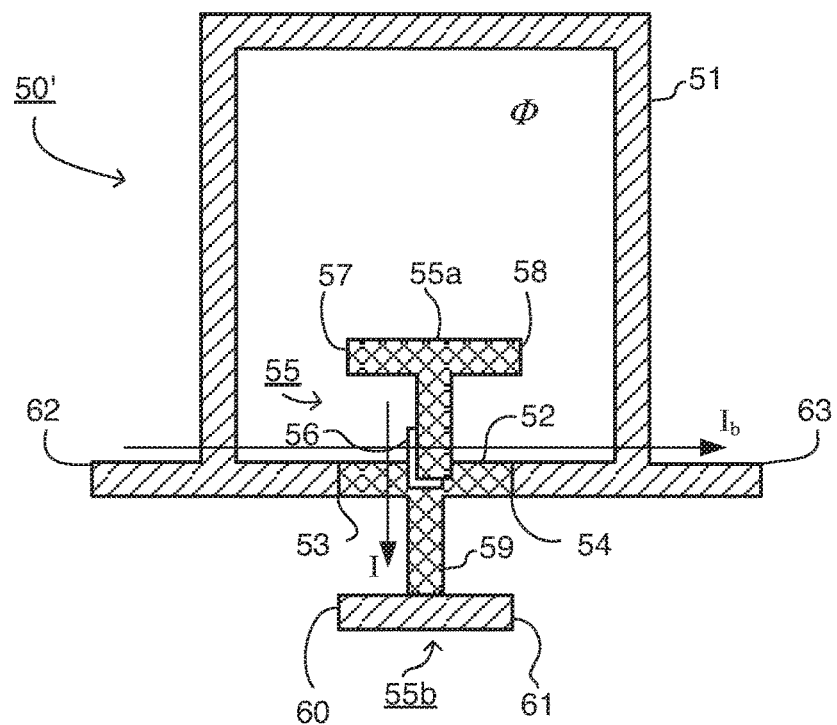
FIG. 2 depicts another quantum interference device known in the art.
Figure 3:
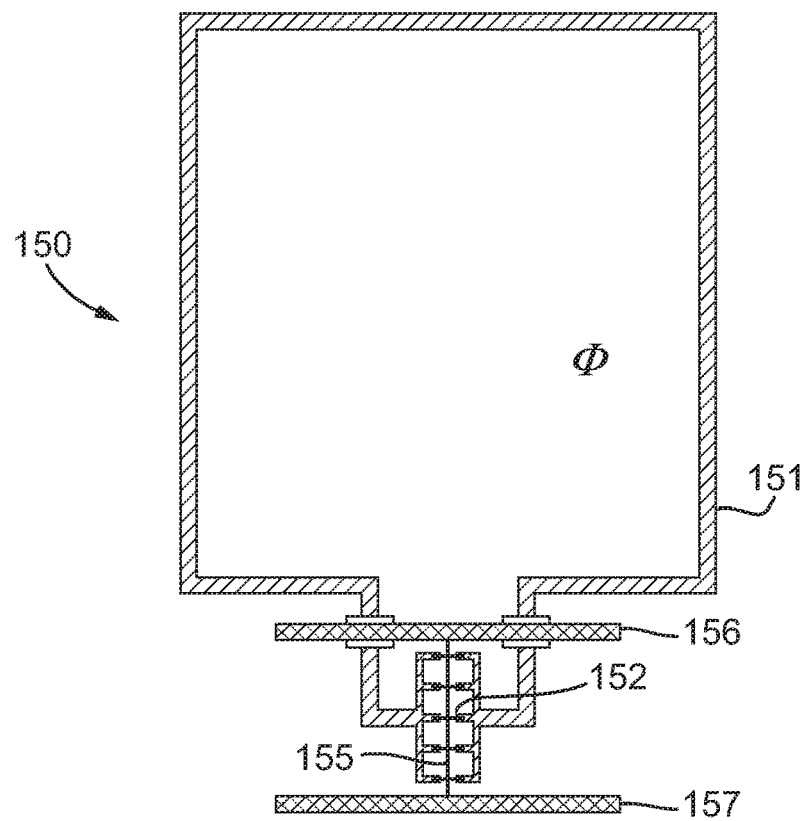
FIG. 3 schematically depicts a quantum interference device according to an embodiment of the invention.
Figure 4:
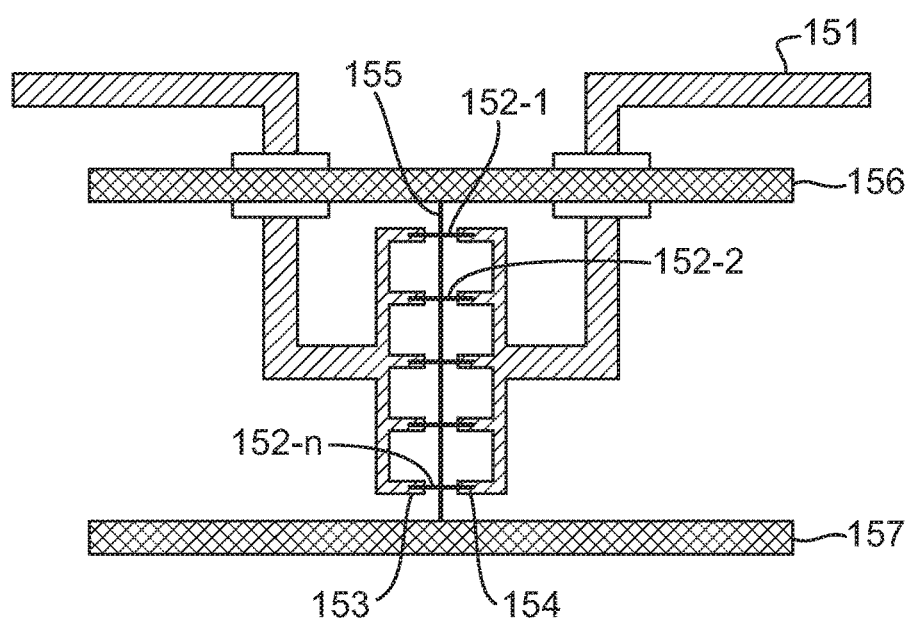
FIG. 4 is an enlarged view of part of the device of FIG. 3.

An improved quantum interference device 150, e.g. useable as a flux sensor or magnetometer, is schematically depicted in FIGS. 3 and 4. FIG. 4 is an enlargement of part of FIG. 3. Quantum interference device 150 comprises a superconducting loop 151 having a gap which is bridged by a plurality of normal conductor segments 152-1 to 152-n. Desirably there are 2N+1 normal conductor segments where N is a positive integer. The superconducting loop 151 and normal conductor segments 152 can be made of any suitable superconducting and normal conducting materials. The superconducting parts of such a device be made of aluminium (Al), or niobium (Nb) for example. Al is advantageous as the natural oxidation of Al forms a passivation layer but Nb has a higher critical temperature Tc. The normal conducting parts of the device can be constructed of Silver (Ag), Gold (Au), Titanium (Ti), Copper (Cu), Antimony (Sb), Bismuth (Bi), carbon nanotubes or graphene, for example.

Normal:superconducting junctions 153, 154 are formed at the ends of the normal conductor segments 152. A crosspiece 155 is connected at the midpoints of normal conductor segments 152 so as to form an interferometer. Crosspiece 155 is desirably formed of the same material and at the same time as normal conductor segments 152. When a flux φ is applied to the superconducting loop 151, quantum interference will occur between electrons reflected at the junctions 153, 154 so that the effective resistance of the crosspiece 155 is cyclically dependent on the flux φ passing through superconductor loop 151.

A conventional approach to using a quantum interference device 150 to measure flux is to apply a known current through the crosspiece 155 and measure the resulting voltage across the crosspiece. As the flux φ through the superconducting loop 151 changes, it causes a cyclic change in the resistance of the crosspiece, leading to a cyclic change in the voltage across the crosspiece at a fixed current through it. Since the resistance variation may be only a few percent of the total resistance of the crosspiece, the cyclic voltage change that is superimposed on a non-oscillating voltage the relative amplitude of the quantum oscillations may be small as well. Therefore, the voltage oscillations caused by changes in flux are difficult to measure, particularly in the case of small flux changes. The use of multiple normal segments 152-1 to 152-$n$ increases the magnitude of the resistance variation, as discussed below.

The central one of the normal conductor segments 152-(2N+1) is referred to herein as the master normal segment which forms a master cross with the crosspiece 155. The loop formed by the superconductor loop 151 and the master normal segment 152-$c$ is referred to herein as the main loop. The area enclosed by the main loop is S. Therefore the flux φ coupled to the main loop is BS where B is the magnetic field through the main loop. In this embodiment, the normal conductor segments 152 are evenly spaced and the area between two adjacent segments 152 is s. In an embodiment the normal conductor segments 152 may have different lengths and/or different spacings. The normal conductor segments 152 need not be geometrically parallel though it is often convenient to make them so.

Normal conductor segments above the central (master) normal segment are within the main loop so they enclose a smaller area than the master segment, the area depending on their distance from the master normal segment. Normal conductor segments below the central (master) normal segment are outside the main loop so they enclose a larger area than the master segment. It is to be noted that it is not necessary that there are an odd number of normal segments, although it simplifies the analysis below.

The output signal of the quantum interference device is given by:

$$\Delta R = -\gamma \left[ \sum_{k=1}^{N} \cos\left(2\pi \frac{BS}{\Phi_0} + 2\pi \frac{kBs}{\Phi_0}\right) + \sum_{k=1}^{N} \cos\left(2\pi \frac{BS}{\Phi_0} - 2\pi \frac{kBs}{\Phi_0}\right) \right] - \gamma \cos\left(2\pi \frac{BS}{\Phi_0}\right) \quad (1)$$

which can be reduced to:

$$\Delta R = -\gamma \cos\left(2\pi \frac{BS}{\Phi_0}\right) - 2\gamma \left[\sum_{k=1}^{N} \cos\left(2\pi \frac{kBs}{\Phi_0}\right)\right] \cos\left(2\pi \frac{BS}{\Phi_0}\right) \quad (2)$$

It can be seen that if there are no extra normal conductor segments (i.e. N=0) then equation (2) reduces to the standard interferometer equation:

$$\Delta R = -\gamma \cos\left(\frac{BS}{\Phi_0}\right) \quad (3)$$

When N>1 the first term in formula (2) describes standard periodic oscillations in the master cross and the second term describes the booster effect due to the contribution to oscillations of the extra crosses modulated by the Fraunhofer interference within the plurality of normal conductor segments 152 between superconducting branches. The Fraunhofer envelope has a maximum at B=0 and becomes narrower with an increase in N and s and so the output signal has maximum enhancement provided the following condition is met $$B << \frac{\Phi_0}{2\pi Ns} \quad (4)$$

then $$\cos\left(2\pi \frac{kBs}{\Phi_0}\right) \approx 1 \text{ so}$$

$$\Delta R \approx \gamma(1 + 2N)\cos\left(2\pi \frac{BS}{\Phi_0}\right) \quad (5)$$

It is desirable that the increase in the signal is greater than the increase in noise. The main source of noise in the quantum interference device is Johnson-Nyquist noise. There will be a contribution to the noise from both the vertical branch and the horizontal branch of each cross.

If the vertical branch of each cross has a resistance $\gamma_v$ then the total noise contribution from the vertical branches (the crosspiece 155) is $$v_N = \sqrt{4k_B T(2N+1)r_v \Delta f} \quad (6)$$

As the number of crosses is increased, noise scales as $\sqrt{2N+1}$ while the signal scales as N.

The current noise $i_{nH}$ in each horizontal branch is given by:

$$\delta I_{J-N} = \sqrt{\frac{4k_B T \Delta f}{r_{sns}}} \quad (7)$$

Which creates flux noise for each branch:

$$\delta \phi_{J-N} = L \delta I_{J-N} \quad (8)$$

where L is the inductance of the main loop.

The superconducting:normal:superconducting elements are connected in parallel. If the elements are uncorrelated the total contribution to the Johnson-Nyquist noise of N crosses will be approximately:

$$(\delta \Phi_{J-N})_L = (2N+1)\sqrt{\frac{4k_B T \Delta f}{(2N+1)r_{sns}}} \quad (9)$$

This flux noise creates voltage noise in the output signal $$v_{nH} = (\delta \Phi_{J-N})_L \frac{dV_{output}}{d\Phi} \quad (10)$$

Where $$\frac{dV_{output}}{d\Phi}$$

is the flux to voltage transfer of the quantum interference device.

The above description applies to the case where the normal conducting segments are connected to a single superconducting loop, however it is not necessary that this is the case. In the general case, an embodiment of the invention may have M loops of different areas $A_m$ each connected to its own set of crosses. The output signal from the quantum interference device $\Delta R_M$ is then $$\Delta R_N = \sum_{m=1}^{M} \gamma_m \left( -\cos 2\pi \frac{A_m B}{\Phi_0} \right) \quad (11)$$

i.e. the output is the sum of a series of cosine functions with amplitudes $\gamma_m$ and periods proportional to the loop areas $A_m$. We can set $\gamma_k$ for each cross by modifying the length of the superconducting:normal:superconducting junction and set the period of oscillations by changing the area $A_m$ of the respective superconducting loop.

Therefore, it is possible to construct a quantum interference device whose output as a function of field can take on any function whose Fourier series contains only cosine terms. The device can be considered a Fourier analyser for the measured field.

Figure 5:
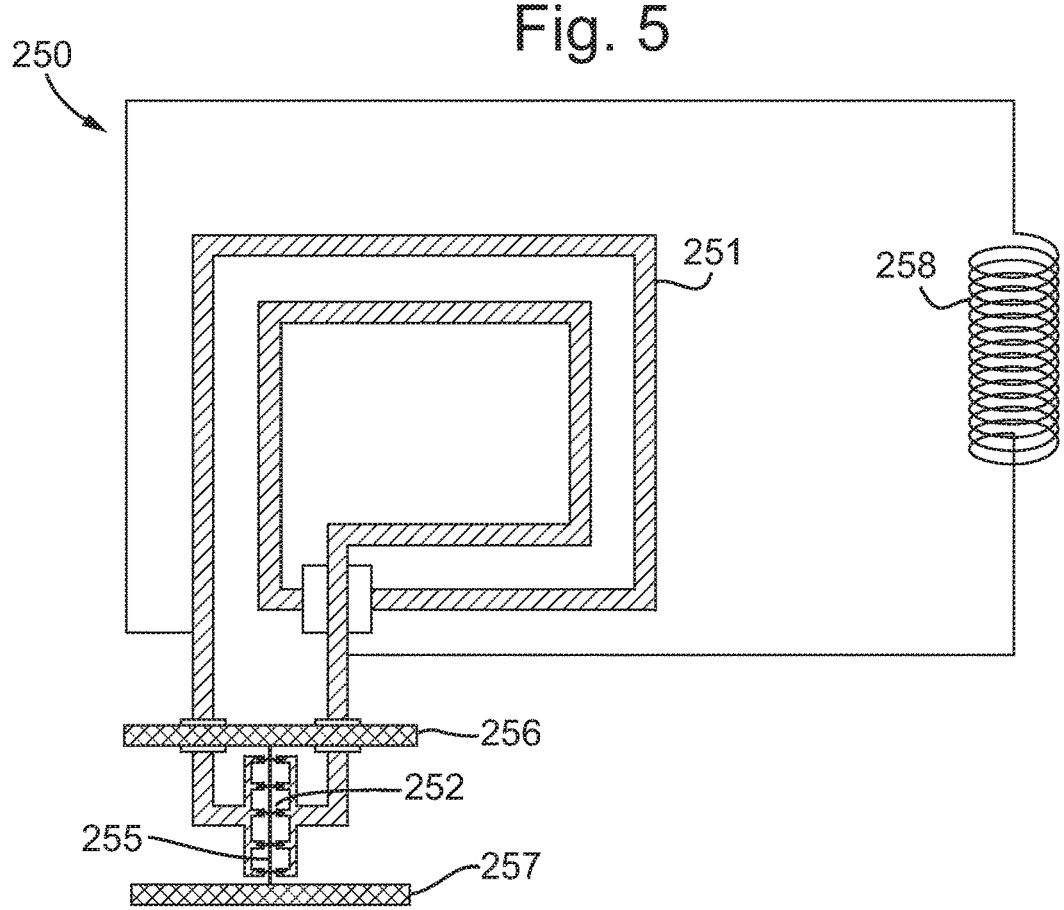
FIG. 5 schematically depicts a quantum interference device according to a second embodiment of the invention.

The arrangement of multiple normal conducting segments of the present invention can be applied to quantum interference devices of various forms. An example of such a quantum interference device 250 is schematically depicted in FIG. 5. Quantum interference device 250 is, for example, useable as a flux sensor or a magnetometer. Quantum interference device 250 includes a superconducting loop 251 interrupted by a gap. A plurality of normal conductor segments 252 bridge the gap. A crosspiece 255 is connected to the middle of the normal conductor segments 252 in order to form an interferometer. Read-out leads 256, 257 are connected to the end of the crosspiece 255.

As shown in FIG. 5, superconducting loop 251 is provided in the form of a coil with multiple nested loops. In the Figure, only two loops are shown, but an embodiment can have as many loops as is required and/or can be accommodated in the available space. The loops can be concentric but need not be. The loops all surround a common area. Due to the increased flux linkage, the frequency of the quantum resistance oscillations induced by changing flux is approximately proportional to the number of loops of the superconducting loop 251, after correcting for differences in the area of each loop. This enhances the sensitivity (transfer function) of the device. An insulating spacer 253 is provided to enable the superconducting loop 251 to cross over itself without electrical contact. By applying an insulating layer, it is also possible to stack superconducting loops vertically. A pickup coil 258, also superconducting, can be connected to the superconducting loop 251 in order to enable measurement of magnetic fields at a remote location.

Figure 6:
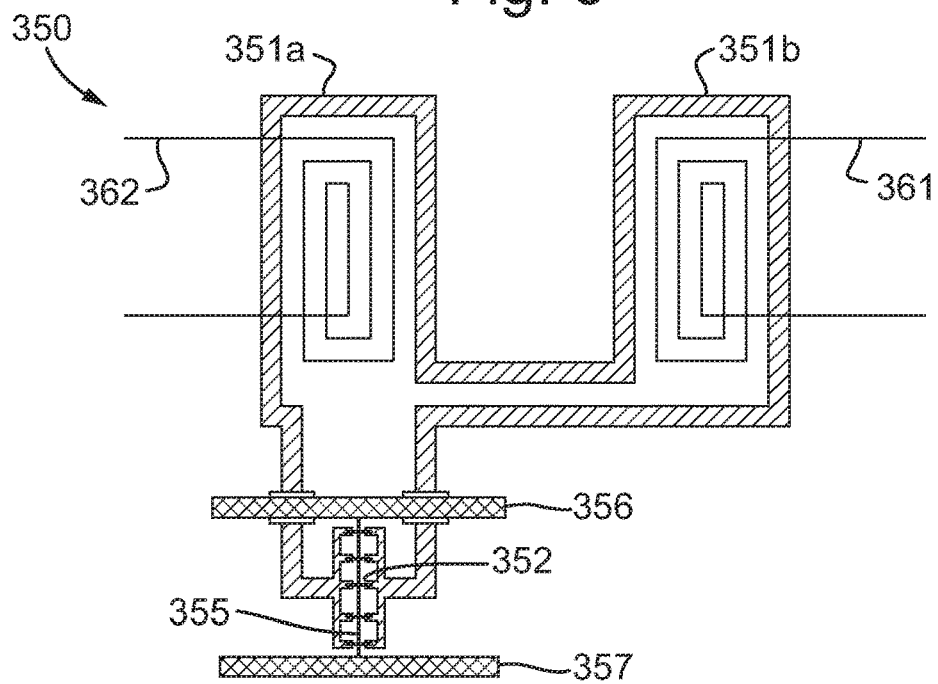
FIG. 6 schematically depicts a quantum interference device according to a third embodiment of the invention.

FIG. 6 schematically depicts the application of the present invention to another quantum interference device 350. Quantum interference device 350 comprises a superconducting loop 351 interrupted by a gap. A plurality of normal conductor segments 352 bridge the gap as discussed above. A crosspiece 355 is attached the midpoint of normal conductor segment 352 in order to form an interferometer. Read-out leads 356, 357 are connected to the ends of crosspiece 355. Superconducting loop 351 has two lobes 351a, 351b. The two lobes are adjacent to each other rather than overlapping or touching. They do not have to be directly adjacent nor close. The two lobes can be formed conveniently in the same layer of an integrated circuit. A pickup coil 362 can be provided in first lobe 351a. Pickup coil 362 allows for measuring the magnetic field at a remote location. A feedback coil 361 can be provided in second lobe 351b. Feedback coil 361 allows cancellation of magnetic fields, e.g. stray magnetic fields, and also to flux modulate the signal. Pickup coil 362 and feedback coil 361 are superconducting. Insulating spacers 353 are provided to enable the superconducting loops 351 to cross over the loops 361 and 362 without electrical contact.

Figure 7:
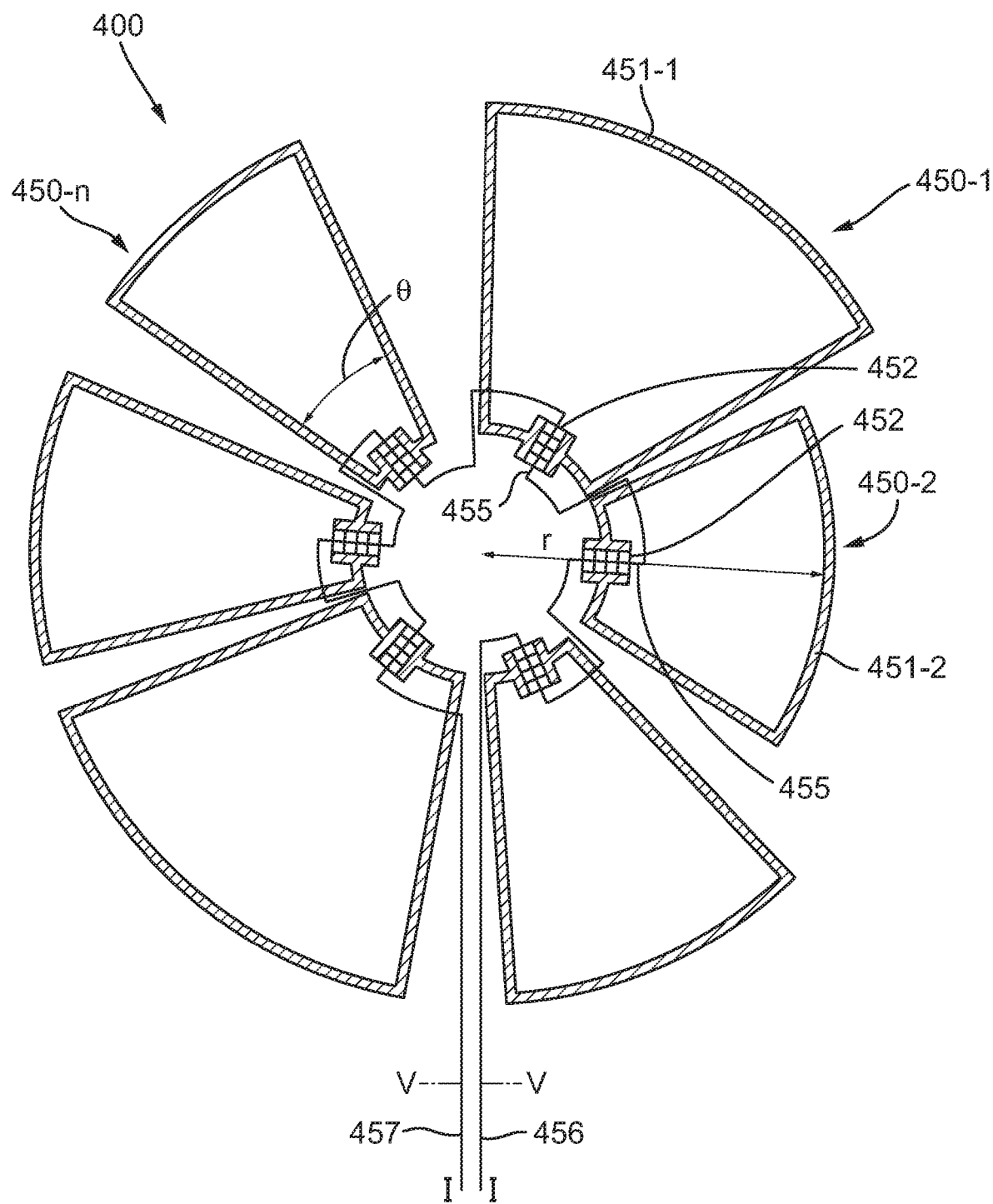
FIG. 7 schematically depicts a compound quantum interference device according to a fourth embodiment of the invention.

FIG. 7 depicts a compound device 400 comprising a plurality of quantum interference devices 450-1 to 450-n operating according to the principles described above. Each of the quantum interference devices 450 includes a superconducting loop 451-1 to 451-n and an interferometer having one or more normal segments 452 connected to a crosspiece 455. The crosspieces 455 are connected in series and to readout line 456, 457. Superconducting loops 451-1 to 451-n generally conform to segments of a circle and have respective areas which may be selected by varying their respective angles θ and radii r. By arranging the superconducting loops as segments of a circle, a compact arrangement can be achieved improving uniformity of the measured field across all segments. By varying the size of the loops and the number of normal segments in each device the compound device can apply a desired function to the measured field. If the loops are all of the same area, the compound device 400 can generate an enhanced signal given by:

$$\Delta R = \gamma \cdot M \cdot (2N+1) \cos \left( \frac{2\pi B s}{\Phi_0} \right) \quad (12)$$

where M is the number of loops, 2N is the number of additional crosses and $\phi_0$ is the flux quantum.

Having described exemplary embodiments of the present invention it will be appreciated that variations on the described embodiments can be made. For example, the use of multiple normal conducting segments can be applied to a variety of quantum interference devices including those described in WO 2012/007736 A1 and PCT/GB2016/052664, which documents are hereby incorporated by reference in their entirety. Features of the different devices described above can be combined in all feasible combinations. The present invention is not to be limited by the above description but rather by the appended claims.

The invention claimed is:

1. A quantum interference device comprising a superconducting loop interrupted by a gap; a plurality of normal conductor segments bridging the gap; and an interferometer connected to the normal conductor segments, wherein the normal conductor segments are spaced apart.

2. A quantum interference device according to claim 1 wherein the normal conductor segments are evenly spaced.

3. A quantum interference device according to claim 1 wherein the distance between the normal conductors are not all equal.

4. A quantum interference device according to claim 1 wherein the lengths of the normal conductor segments are all equal.

5. A quantum interference device according to claim 1 wherein the lengths of the normal conductor segments are not all equal.

6. A quantum interference device according to claim 1 wherein the superconducting loop comprises a plurality of turns.

7. A quantum interference device according to claim 6 wherein the plurality of turns comprises a plurality of adjacent lobes.

8. A quantum interference device according to claim 7 further comprising a coil located within a lobe of the superconducting loop.

9. A quantum interference device according to claim 8 having two lobes and a coil located within each lobe of the superconducting loop.

10. A magnetometer device comprising: a quantum interference device according to claim 9; a pick-up coil connected to a coil located in one lobe of the superconducting loop; and a feedback current source connected to a coil located in another lobe of the superconducting loop.

11. A quantum interference device according to claim 6 wherein the plurality of turns comprises a plurality of nested loops.

12. A device according to claim 1 further comprising a pair of read-out leads connected to the interferometer of the quantum interference device.

13. A compound device comprising a plurality of quantum interference devices according to claim 1 wherein the interferometers of the quantum interference devices are connected in series.

14. A compound device according to claim 13 wherein the superconducting loops of the quantum interference devices fit in segments of a circle.

15. A quantum interference device comprising an incomplete superconducting loop with opposed ends; a plurality of paired branches extending in parallel from the opposed ends of the superconducting loop; a plurality of normal conductor segments bridging between the branches; and a normal conducting crosspiece connected to the midpoints of the normal conductor segments.

16. A quantum interference device according to claim 15 where the area enclosed by the superconducting branches and the normal conductor segments is much less than the area enclosed by the superconducting loop.

17. A compound device comprising a plurality of quantum interference devices according to claim 15 wherein the interferometers of the quantum interference devices are connected in series.

* * * * *